(12) United States Patent
Takabayashi (10) Patent No.: US 9,742,305 B2
(45) Date of Patent: Aug. 22, 2017

(54) POWER CONVERSION APPARATUS (71) Applicant: MITSUBISHI ELECTRIC CORPORATION, Chiyoda-ku, Tokyo (JP)

(72) Inventor: Hirokazu Takabayashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/114,878

(22) PCT Filed: Feb. 7, 2014

(86) PCT No.: PCT/JP2014/052883
§ 371 (c)(1),
(2) Date: Jul. 28, 2016

(87) PCT Pub. No.: WO2015/118654
PCT Pub. Date: Aug. 13, 2015

(65) Prior Publication Data
US 2016/0352242 A1 Dec. 1, 2016

(51) Int. Cl.
*H02M 7/00* (2006.01)
*H05K 7/20* (2006.01)

(52) U.S. Cl.
CPC ............ *H02M 7/003* (2013.01); *H05K 7/209* (2013.01); *H05K 7/20336* (2013.01); *H05K 7/20936* (2013.01)

(58) Field of Classification Search
CPC ... H02M 7/003; H05K 7/20936; H05K 7/209; H05K 7/20336

(Continued)

(56) References Cited

U.S. PATENT DOCUMENTS

2008/0198548 A1* 8/2008 Nakamura ......... H05K 7/20927
361/689
2011/0032674 A1* 2/2011 Fujiki ................ H05K 7/20909
361/695

(Continued)

FOREIGN PATENT DOCUMENTS

JP 11-089248 3/1999
JP 11-127583 A 5/1999

(Continued)

OTHER PUBLICATIONS

International Search Report (PCT/ISA/210) issued on Apr. 22, 2014, by the Japanese Patent Office as the International Searching Authority for International Application No. PCT/JP2014/052883.

(Continued)

*Primary Examiner* — Anthony Haughton
*Assistant Examiner* — Yahya Ahmad
(74) *Attorney, Agent, or Firm* — Buchanan Ingersoll & Rooney PC (57) ABSTRACT

A frame portion is a plate-like member to which a cooler is attached for cooling an electric circuit element configured to operate for power conversion that causes generation of heat. The capacitor is a structural member disposed in a direction perpendicular to the frame portion and including a capacitor element electrically connected to the electric circuit element. The capacitor includes a first support surface and a second support surface that are external surfaces facing in opposite directions from each other and parallel to the direction perpendicular to the frame portion. The first frame and the second frame each have an end portion fixed to a connection frame. The first frame includes a first attachment surface fixed to a first support surface. The second frame includes a second attachment surface fixed to a second support surface.

9 Claims, 10 Drawing Sheets

(58) Field of Classification Search
USPC .................................................. 361/688–723
See application file for complete search history.

(56) References Cited

U.S. PATENT DOCUMENTS

| | | | | |
|---|---|---|---|---|
| 2011/0116235 A1* | 5/2011 | Ryu | ........................ | B60L 3/00 |
| | | | | 361/699 |
| 2011/0181105 A1* | 7/2011 | Michinaka | ............ | H01L 25/162 |
| | | | | 307/9.1 |
| 2011/0194246 A1* | 8/2011 | Nakasaka | .......... | H05K 7/20927 |
| | | | | 361/688 |
| 2011/0228508 A1* | 9/2011 | Inuduka | ................ | H02M 7/003 |
| | | | | 361/811 |
| 2012/0188712 A1* | 7/2012 | Ishibashi | ............... | H02M 7/003 |
| | | | | 361/688 |
| 2014/0284765 A1* | 9/2014 | Kiuchi | .................... | H01L 28/40 |
| | | | | 257/532 |

FOREIGN PATENT DOCUMENTS

| | | |
|---|---|---|
| JP | 11-136960 A | 5/1999 |
| JP | 2000-152662 A | 5/2000 |
| JP | 2002-290088 A | 10/2002 |
| JP | 2005-229708 A | 8/2005 |
| JP | 2007-215396 A | 8/2007 |
| JP | 2008-206243 A | 9/2008 |
| JP | 2012-028400 A | 2/2012 |
| WO | WO 2007/080922 | 7/2007 |

OTHER PUBLICATIONS

Written Opinion (PCT/ISA/237) issued on Apr. 22, 2014, by the Japanese Patent Office as the International Searching Authority for International Application No. PCT/JP2014/052883.

* cited by examiner

POWER CONVERSION APPARATUS

TECHNICAL FIELD

The present disclosure relates to a power conversion apparatus.

BACKGROUND ART

A typical on-board power conversion apparatus for trains includes a circuit unit provided with an inverter circuit for converting DC power into AC power, a capacitor unit provided with a filter capacitor for stabilizing voltage input to an inverter circuit, and the like. The voltage of the DC power input to the inverter circuit for trains is, for example of the order of 1500 V. The filter capacitor thus requires high capacitance to accommodate the power, and when a molded capacitor with multiple capacitor elements molded to obtain the high capacity is employed as the filter capacitor, the molded capacitor weighs on the order of 25 to 60 kg. Such a heavy filter capacitor vibrates during train movement.

To address this issue, a conventional on-board power conversion apparatus for trains includes a capacitor unit in which a molded capacitor is accommodated and firmly fixed in a box-shaped housing constituted by a frame member, a reinforcing member, and the like to ensure strength high enough to resist the weight of the filter capacitor and its vibration over a long period of time (see, for example, Patent Literature 1). The housing is typically provided with a mounting plate on which the molded capacitor is fixedly mounted.

CITATION LIST

Patent Literature

Patent Literature 1: Unexamined Japanese Patent Application Kokai Publication No. 2005-229708

SUMMARY OF INVENTION

Technical Problem

However, the housing for accommodating the molded capacitor disadvantageously results in a complicated structure to ensure the strength.

The present disclosure has been made in view of the foregoing, and an objective of the present disclosure is to provide a power conversion apparatus capable of ensuring sufficient strength with a simple structure.

Solution to Problem

To achieve the objective, the power conversion apparatus according to the present disclosure includes an electric circuit element, a cooler, a connection frame, a capacitor, a first frame, and a second frame. The electric circuit element operates for power conversion, which generates heat. The cooler is attached to the electric circuit element and is configured to cool the electric circuit element by releasing into the air the heat generated by the electric circuit element during operation. The connection frame includes a plate-like frame portion to which the cooler is attached. The capacitor is a structural member disposed in a direction perpendicular to the frame portion and including a capacitor element electrically connected to the electric circuit element. The capacitor includes a first support surface and a second support surface that are external surfaces facing in opposite directions from each other and parallel to the direction perpendicular to the frame portion. The first frame includes an end portion fixed to the connection frame and a first attachment surface fixed to the first support surface. The second frame includes an end portion fixed to the connection frame and a second attachment surface opposed to the first attachment surface and fixed to the second support surface.

Advantageous Effects of Invention

The present disclosure provides a power conversion apparatus capable of ensuring sufficient strength with a simple structure since the capacitor forms a structural member together with the first frame and the second frame.

DESCRIPTION OF EMBODIMENTS

Embodiments of the present disclosure are hereinafter described with reference to the drawings. Throughout the drawings, like or identical elements are designated by like or identical reference signs and are not described repeatedly. Moreover, the terms indicating forward-backward, up-down, and left-right throughout the specification and the drawings are intended to be used for explanation of the direction, but not to limit the scope of the present disclosure.

Embodiment 1

A power conversion apparatus 100 according to Embodiment 1 of the present disclosure is installed within a railway car, and converts DC power taken from an overhead line into three-phase AC power and outputs the AC power to an induction motor, which is a load. The power conversion apparatus 100 may be any apparatus capable of converting input power into output power for supply to a load. In addition to installation in the railway car, the power conversion apparatus 100 may be installed, for example, in mobile cranes, watercraft, aircraft, industrial machines, and the like.

The power conversion apparatus 100 includes, as illustrated in FIGS. 1 to 5, an electric circuit element 101, a cooling unit 102, a connection frame 103, a plurality of capacitors 104, a first frame 105, a second frame 106, a first fastener 107, a second fastener 108, and an electrical conductor 109.

Figure 1:
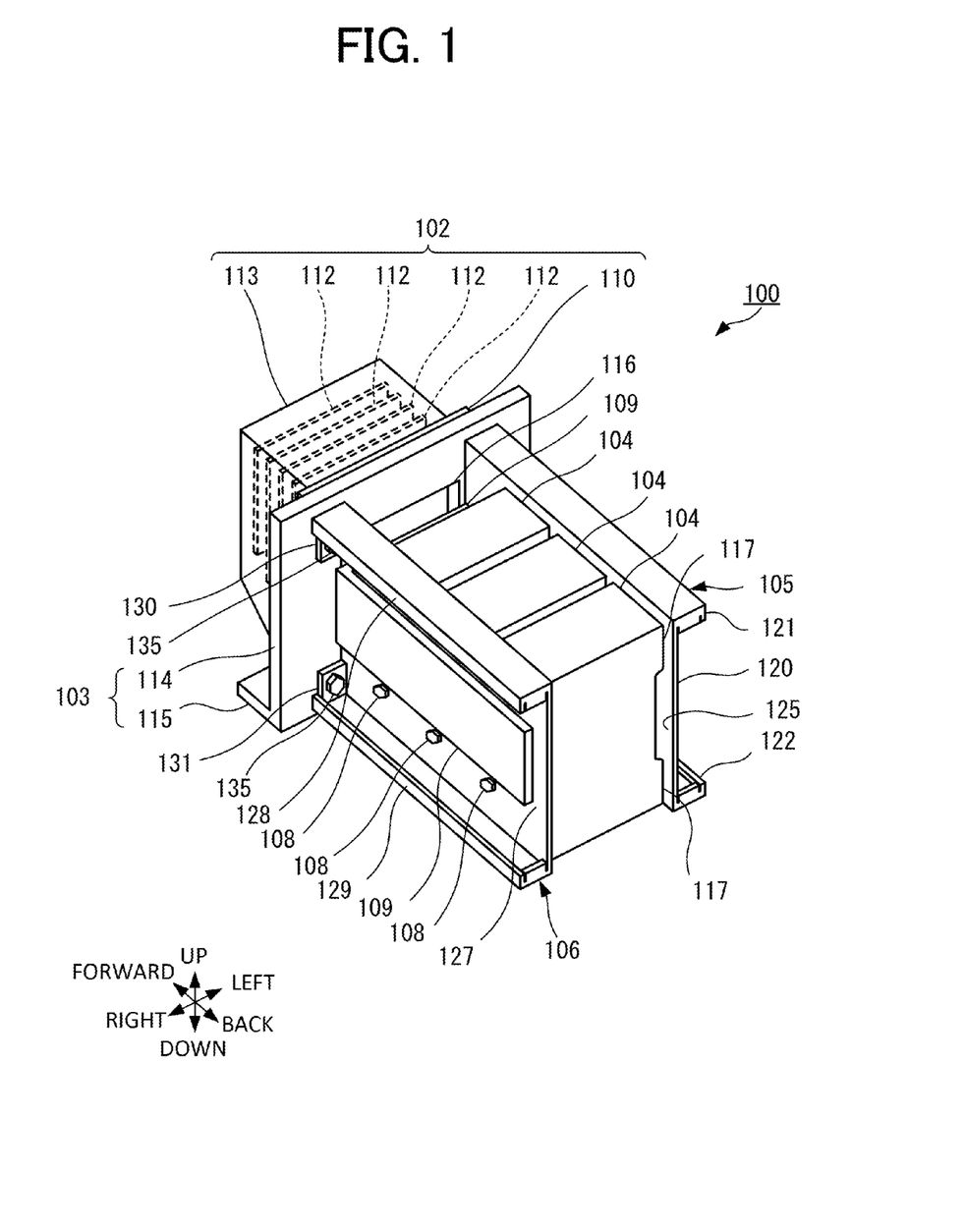
FIG. 1 is a perspective view of a power conversion apparatus according to Embodiment 1 of the present disclosure.
Figure 2:
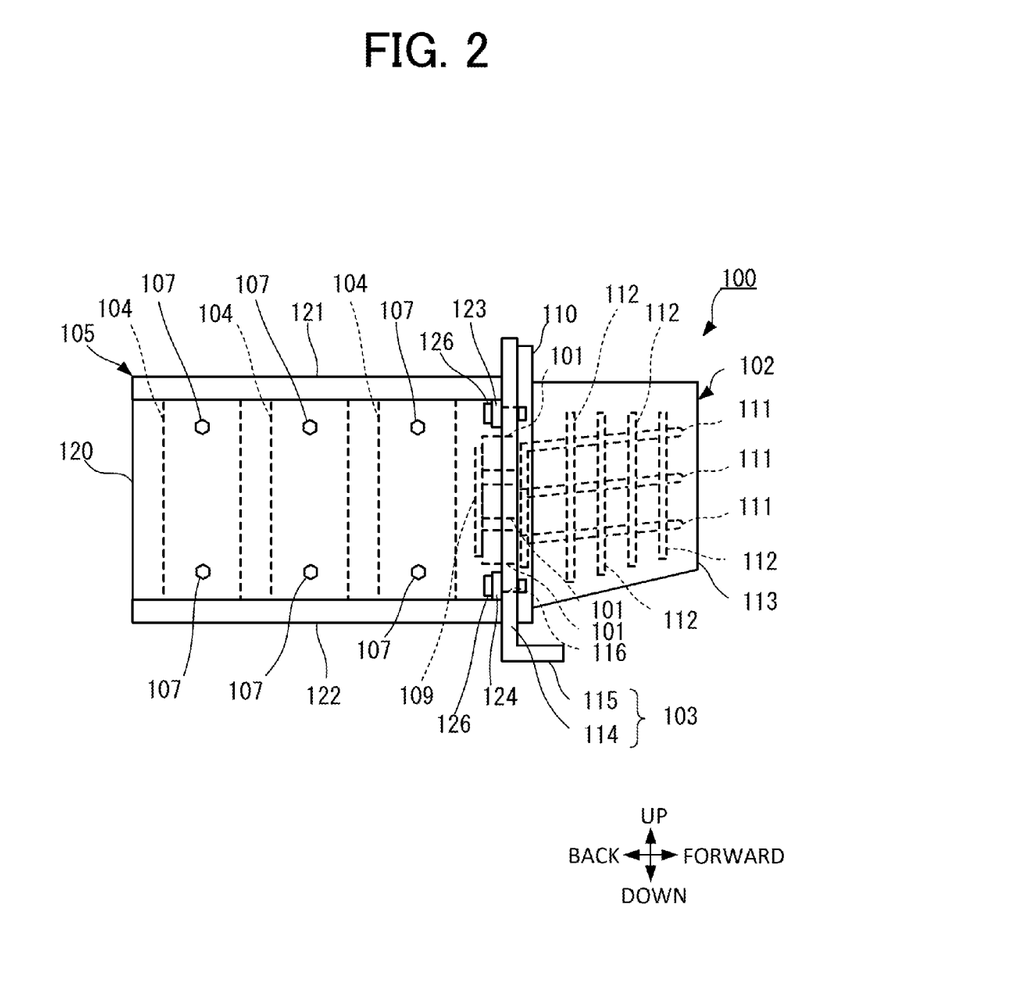
FIG. 2 is a left side view of the power conversion apparatus according to Embodiment 1.
Figure 3:
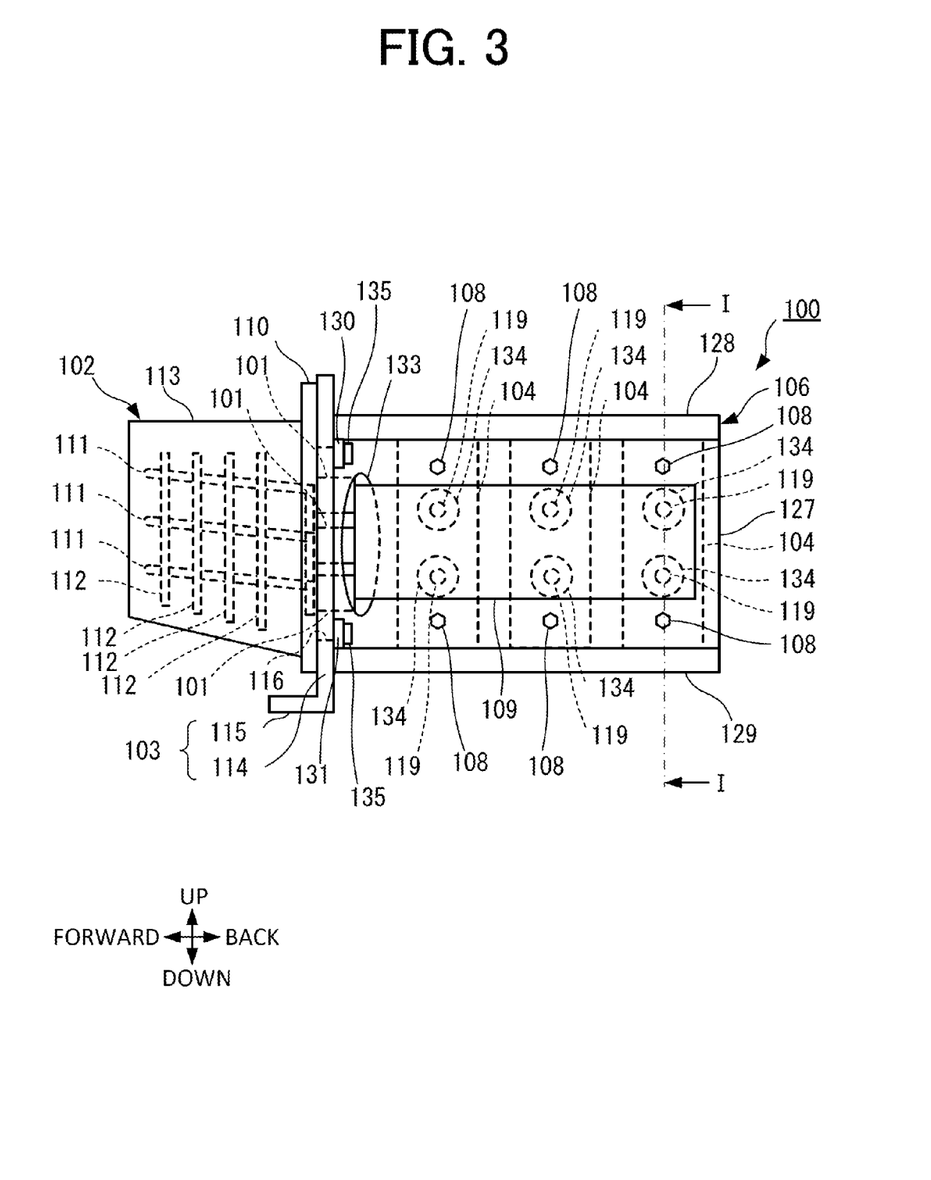
FIG. 3 is a right side view of the power conversion apparatus according to Embodiment 1.
Figure 4:
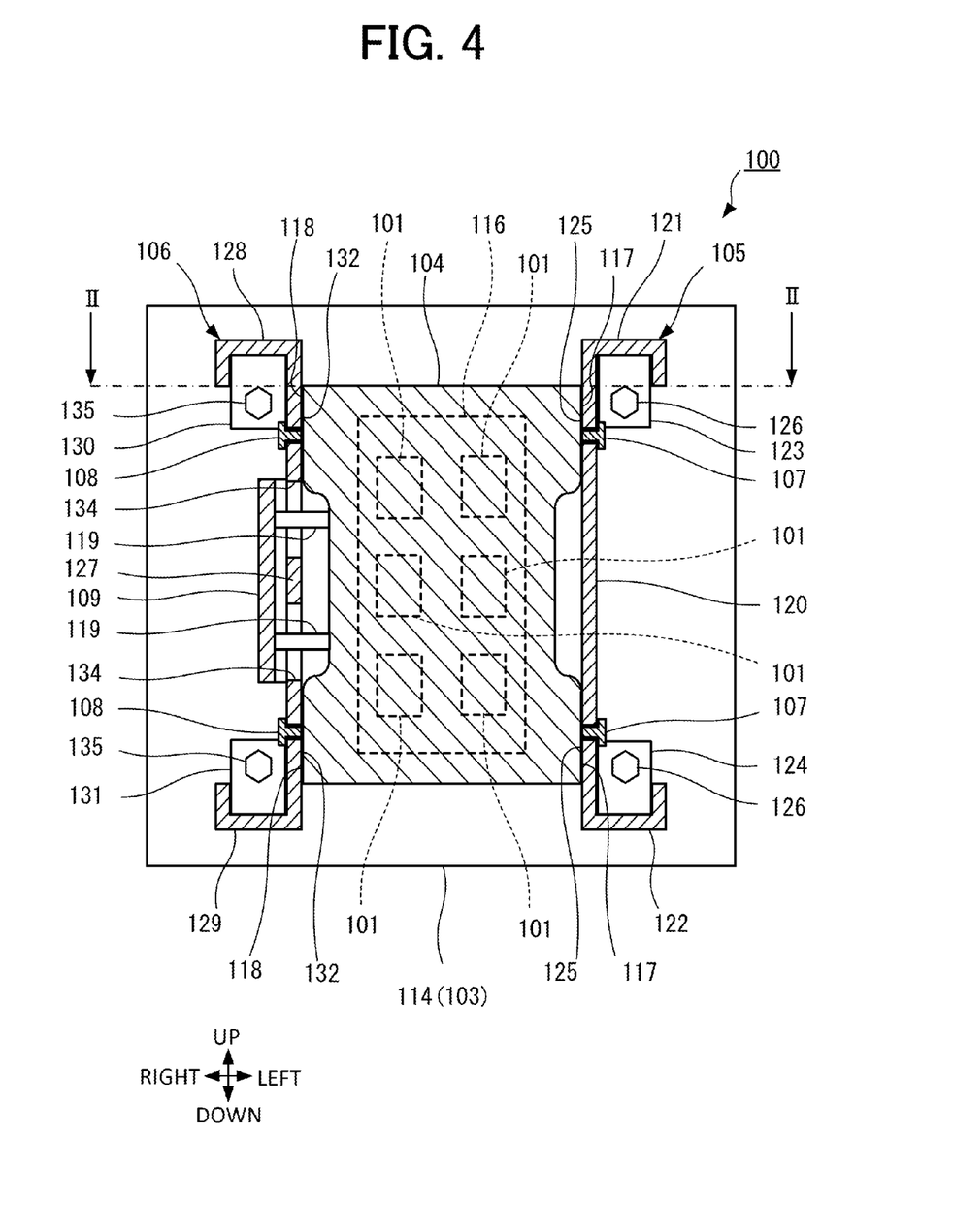
FIG. 4 is a cross sectional view of the power conversion apparatus according to Embodiment 1 as viewed from the rear.
Figure 5:
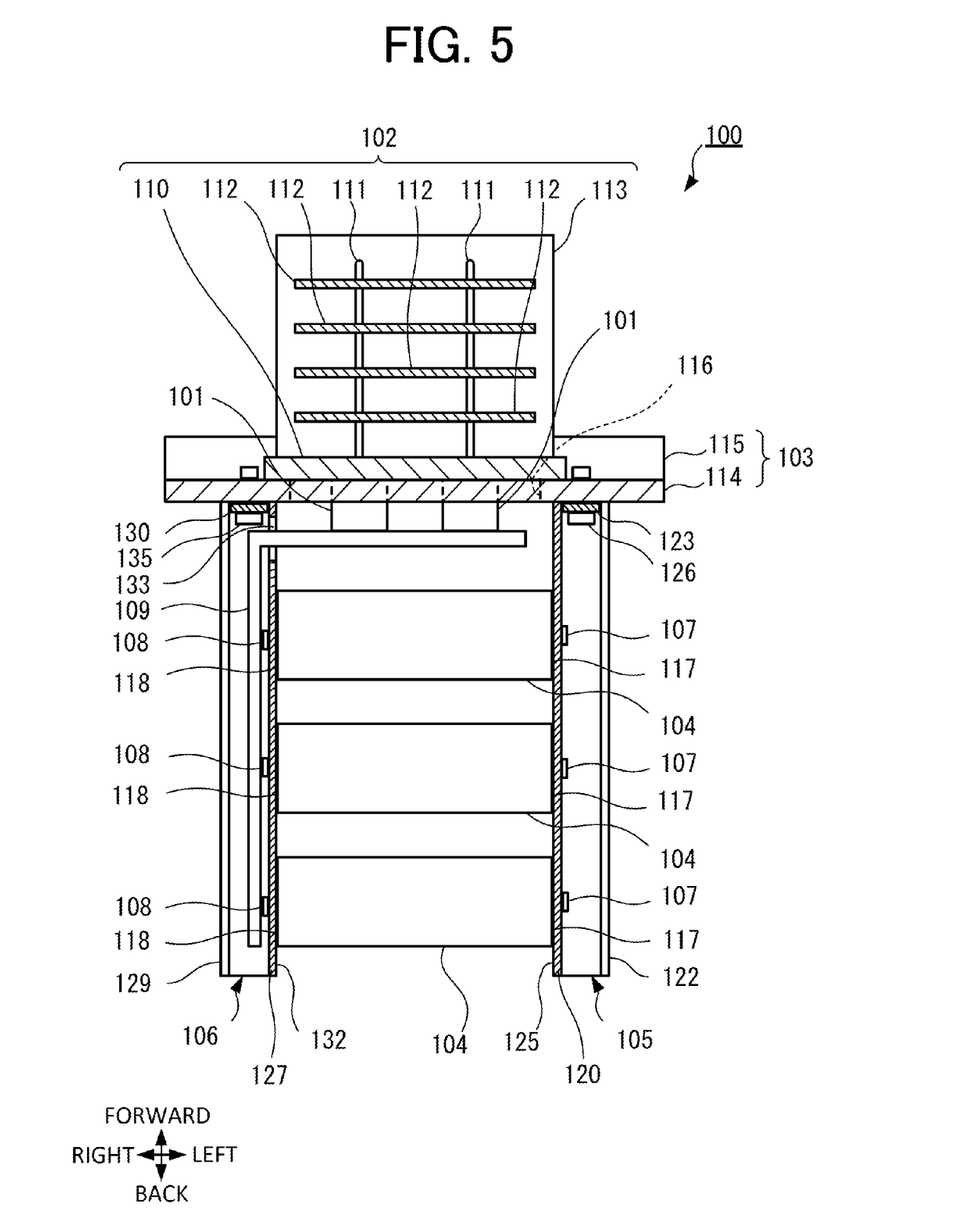
FIG. 5 is a cross sectional view of the power conversion apparatus according to Embodiment 1 as viewed from above.

FIG. 1 is a perspective view of the power conversion apparatus 100 as viewed from the upper right rear. FIGS. 2 and 3 are a left side view and a right side view of the power conversion apparatus 100, respectively. FIG. 4 is a cross sectional view of the power conversion apparatus 100, taken along the line I-I of FIG. 3 as viewed from the rear. FIG. 5 is a cross sectional view of the power conversion apparatus 100, taken along the line II-II of FIG. 4 as viewed from above.

The electric circuit element 101 is an element that operates for power conversion, which generates heat. The electric circuit element 101 is, for example, an insulated gate bipolar transistor (IGBT) element, and is included in, for example, an inverter circuit for converting the DC input power to the AC output power.

The cooling unit (cooler) 102 is a unit for cooling the electric circuit element 101 which generates heat during operation, and includes, particularly as illustrated in FIG. 2, a base portion 110, a heat pipe 111, a heat dissipating fin 112, and a cover 113.

The base portion 110 is a plate-like member made of a highly thermally conductive material such as aluminum, copper, or the like, and forms a generally rectangular shape as viewed from the front. The electric circuit element 101 is mounted in contact with the rear surface of the base portion 110 so as to conduct heat generated by the electric circuit element 101 during operation.

The heat pipe 111 is a thermal conducting member having an enclosed internal space filled with refrigerant. The base end portion of the heat pipe 111 is in contact with the base portion 110 to provide thermal conduction, and is, for example, embedded in the base portion 110 in the up-down direction. The heat pipe 111 bends at the upper end of the base end portion, and extends forward and upward from the upper end.

A plurality of heat dissipating fins 112, which is a plate-like member made of a highly thermally conductive material, is arranged in parallel to and in front of the base portion 110. Each heat dissipating fin 112 forms a generally rectangular shape as viewed from the front, and is provided with a plurality of holes. The heat pipe 111 is inserted into each hole so that the outer peripheral surface of the heat pipe 111 is in contact with the hole for conduction of heat from the heat pipe 111 to the heat dissipating fin 112.

The cover 113, which encloses the heat pipe 111 and the heat dissipating fin 112, is fixed to the base portion 110. The cover 113 includes, for example a wire mesh, to prevent entry of foreign objects such as dead leaves or the like, and includes an opening for airflow between the interior and the exterior.

Such a cooling unit 102 conducts heat, which is generated by the electric circuit element 101 during operation, sequentially from the base portion 110 through the heat pipe 111 to the heat dissipating fin 112. The heat conducted to the surface of the heat dissipating fin 112 is released through the opening of the cover 113 into the air flowing around the heat dissipating fin 112. The electric circuit element 101 is thereby cooled.

The connection frame 103 is a member disposed between the cooling unit 102 and the capacitor unit (the capacitors 104, the first frame 105, and the second frame 106) to connect between the units, and includes a frame portion 114 and a leg portion 115.

The frame portion 114 is a plate-like member having a direction perpendicular to the forward-backward direction, and forms a generally rectangular shape as viewed from the front. The frame portion 114 is provided with a through-hole 116 having a generally rectangular shape as viewed from the front. The leg portion 115 extends forward from the lower end of the frame portion.

The cooling unit 102 is fixed to the frame portion 114 in front. Specifically, the front surface of the frame portion 114 faces the rear surface of the base portion 110, and the frame portion 114 and the base portion 110 are fixed with, for example, an unillustrated bolt and nut. The electric circuit element 101 mounted on the rear surface of the base portion 110 is disposed in the through-hole 116.

The capacitor unit is fixed to the frame portion 114 at the rear side thereof. Specifically, at the rear surface of the frame portion 114, the first frame 105 and the second frame 106 are fixed at locations where the first and second frames sandwich the electric circuit element 101 disposed in the through-hole 116 as viewed from the rear. A plurality of capacitors 104 is fixed between the first frame 105 and the second frame 106.

Each capacitor 104 is a member including a capacitor element electrically connected to the electric circuit element 101 and is a structural member of the capacitor unit. Specific examples of each capacitor 104 include a molded capacitor including a capacitor element and made of resin or the like. The capacitor element serves, for example, as a filter capacitor for stabilizing current of the DC power input to the electric circuit element 101.

Each capacitor 104 forms a rectangular parallelepiped having a narrowed portion in the middle in the up-down direction of the capacitor 104, especially as illustrated in FIG. 4. The capacitors 104 are arranged and spaced apart from each other, in the forward-backward direction at the rear side of the frame portion 114, particularly as illustrated in FIG. 1. The most forward capacitor 104 is arranged and spaced apart from the electric circuit element 101 so as to face the electric circuit element 101. Such arrangement with a space between the electric circuit element 101 and the capacitor 104 forms a space (heat dissipation space) for release of heat generated by the electric circuit element 101 and the capacitor 104.

A single capacitor 104 can be used, but the use of a plurality of capacitors 104 provides a heat dissipation space between the capacitors 104, which facilitates heat dissipation of the capacitors 104 and improves the cooling effect of the capacitors 104.

Each capacitor 104 includes a first support surface 117, a second support surface 118, and terminals 119.

The first support surface 117 and the second support surface 118 face in opposite directions from each other, and are external surfaces parallel to the direction perpendicular to the frame portion 114. In the present embodiment, the first support surface 117 and the second support surface 118 are a left end side and a right end side, respectively, as viewed from the front, and are separated into an upper side and a lower side via the narrowed portion. The first support surface 117 is provided, at each of the upper and lower sides thereof, with an internal thread to secure a first fastener 107, for example a bolt. The second support surface 118 is provided, at each of the upper and lower sides thereof, with an internal thread to secure a second fastener 108, for example a bolt.

Each terminal 119 is electrically connected to the capacitor element and protrudes leftward from the left side of the narrowed portion of the respective capacitor 104.

The first frame 105 is a structural member that forms the left side portion of the capacitor unit, and includes a first attachment portion 120, a first upper extension portion 121, a first lower extension portion 122, a first upper front end portion 123, and a first lower front end portion 124, as illustrated in FIGS. 2 and 4.

The first attachment portion 120, which extends vertically in the forward-backward directions, is a plate-like portion forming a generally rectangular shape as viewed from the left, and includes a plurality of fastener holes for insertion of the first fastener 107 and a first attachment surface 125. The first attachment surface 125 is a right side major surface of the first attachment portion 120 and is secured in abutting relation to the first support surfaces 117 of the capacitors 104.

The first upper extension portion 121 is a portion extending leftward from the upper end of the first attachment portion 120 and further extending downward from the left end of the extended portion. The first lower extension portion 122 is a portion extending leftward from the lower end of the first attachment portion 120 and further extending upward from the left end of the extended portion.

The first upper front end portion 123 and the first lower front end portion 124 are both the front end portions of the first frame 105, and are portions for fixing the first frame 105 to the frame portion 114. In this embodiment, the first upper front end portion 123 is a plate-like portion extending downward from the front end of the first upper extension portion 121, and the first lower front end portion 124 is a plate-like portion extending upward from the front end of the first lower extension portion 122. The first upper front end portion 123 and the first lower front end portion 124 each have a front surface secured in abutting relation to the rear surface of the frame portion 114 by a first fixture 126 for fixing the first frame 105 and the frame portion 114. The first fixture 126 includes, for example, a bolt and nut for clamping through a hole formed in association with the respective ones of the first upper front end portion 123, the first lower front end portion 124, and the frame portion 114, The second frame 106 is a structural member that forms the right side portion of the capacitor unit, and includes a second attachment portion 127, a second upper extension portion 128, a second lower extension portion 129, a second upper front end portion 130, and a second lower front end portion 131, as illustrated in FIGS. 3 and 4.

The second attachment portion 127, which extends vertically in the forward-backward directions, is a plate-like portion forming a generally rectangular shape as viewed from the right, and includes a plurality of fastener holes for insertion of the second fastener 108, a second attachment surface 132, an electrical conductor passage portion 133, and a plurality of terminal insertion holes 134.

The second attachment surface 132 is a left side major surface of the second attachment portion 127, and is thereby in a mutually-opposing relationship with the first attachment surface 125. The second attachment surface 132 is secured in abutting relation to the second support surfaces 118 of the capacitors 104.

The electrical conductor passage portion 133 forms a hole as a space for passaging the electrical conductor 109 in the left-right direction. The space for passage of the electrical conductor 109 is not limited to the hole, but may be, for example, a cutout formed in the second attachment portion 127.

Each terminal insertion hole 134 is a through-hole for passage and placement of a single terminal 119 of the capacitors 104.

The terminal insertion holes 134 are not limited to holes disposed in one-to-one correspondence to the terminals 119 of the capacitors 104, but may be holes through each of which a plurality of terminals 119 of the capacitors 104 passes. In addition, each terminal insertion hole 134 may communicate with a hole formed by the electrical conductor passage portion 133. This leaves a large open space to the right of the electric circuit element 101 and the capacitors 104, thus allowing for ease of flow of air in the heat dissipation space. The ease of flow results in enhanced heat dissipation of air from the electric circuit element 101 and the capacitors 104 to the heat dissipation space, which improves the cooling effects of the electric circuit element 101 and the capacitors 104.

The second upper extension portion 128 is a portion extending rightward from the upper end of the second attachment portion 127 and further extending downward from the right end of the extended portion. The second lower extension portion 129 is a portion extending rightward from the lower end of the second attachment portion 127 and further extending upward from the right end of the extended portion.

The second upper front end portion 130 and the second lower front end portion 131 are both the front end portions of the second frame 106, and are portions for fixing the second frame 106 to the frame portion 114. The second upper front end portion 130 according to the present embodiment is a plate-like portion extending downward from the front end of the second upper extension portion 128. The second lower front end portion 131 is a plate-like portion extending upward from the front end of the second lower extension portion 129. The second upper front end portion 130 and the second lower front end portion 131 each have a front surface secured in abutting relation to the rear surface of the frame portion 114 by a second fixture 135 for fixing the second frame 106 and the frame portion 114. The second fixture 135 includes, for example, a bolt and nut for clamping through a hole formed in the respective ones of the second upper front end portion 130, the second lower front end portion 131, and the frame portion 114.

The first fastener 107 is a member for securing the first frame 105 to the capacitors 104, and the second fastener 108 is a member for securing the second frame 106 to the capacitors 104. The first fastener 107 and the second fastener 108 according to the present embodiment are, for example, bolts, which are inserted into respective fastener holes of the first attachment portion 120 and the second attachment portion 127, and are tightened respectively using internal threads disposed in the fastener holes of the first support surfaces 117 and the second support surfaces 118 of the capacitors 104.

The electrical conductor 109 is a member for electrically connecting between the electric circuit element 101 and the terminals 119 of the capacitors 104, and includes a laminated bus bar, an electric wire, or the like. The electrical conductor 109 of the present embodiment is a bent laminated bus bar and, as illustrated in FIG. 5, includes a portion that is opposed to the electric circuit element 101 at the backside thereof, is electrically connected thereto, and passes through the electrical conductor passage portion 133, and by a portion that bends at the right end of the portion and further extends backward to be electrically connected to the terminal 119.

Figure 6:
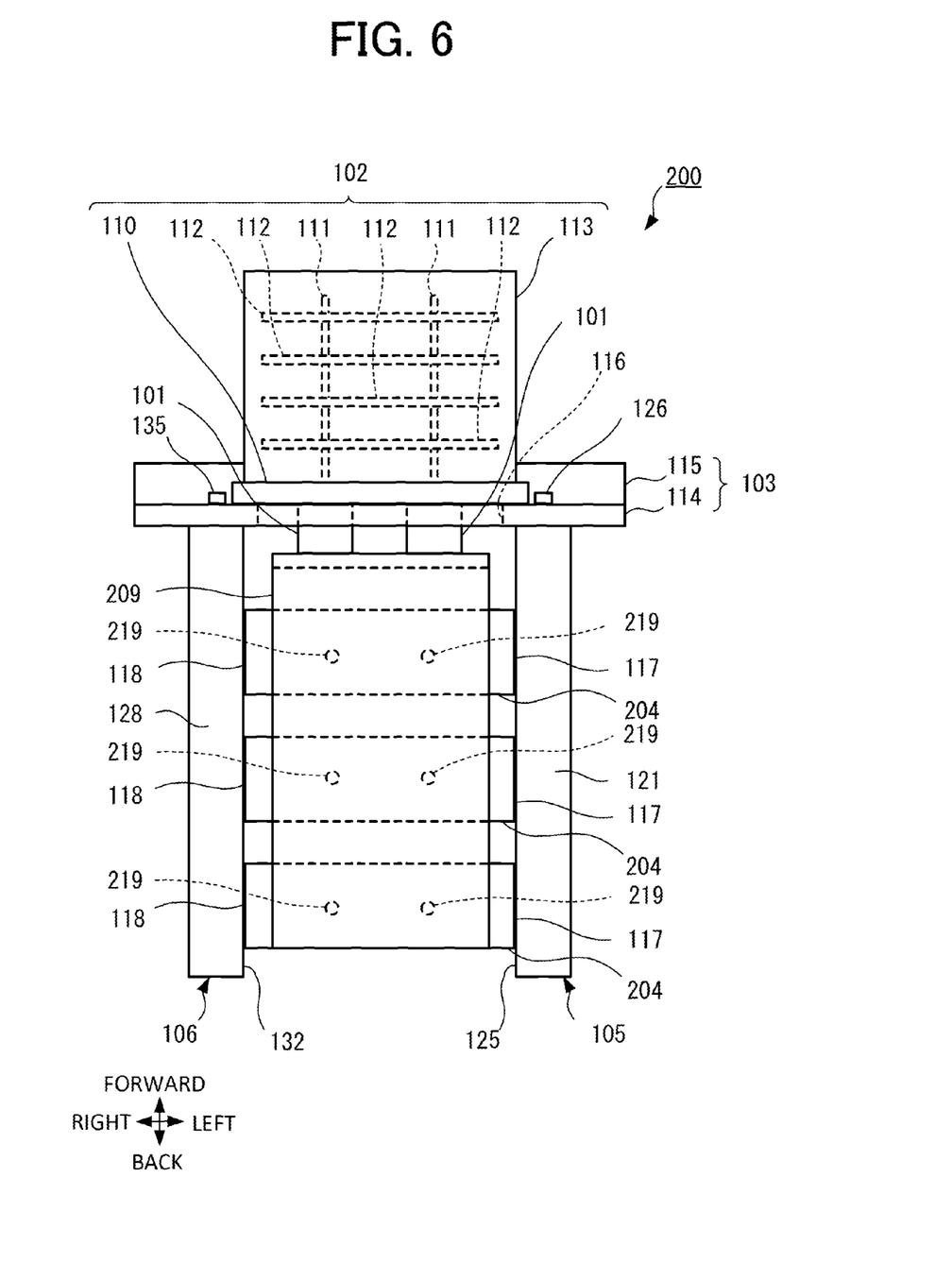
FIG. 6 is a top view of a power conversion apparatus according to a variant embodiment.

As illustrated in FIG. 6, in a power conversion apparatus 200 according to one variant embodiment, a terminal 219 of a capacitor 204 may protrude upwardly. In this case, for example, a laminated bus bar, which is an electrical conductor 209, is electrically connected to the electric circuit element 101 at a plate-like portion of the laminated bus bar that is opposed to the electric circuit element 101 at the backside thereof, bends at the upper end of the plate-like portion and extends backward therefrom, and is electrically connected to the terminal 219 at the backward extended portion. The second frame 106 may be optionally provided with the electrical conductor passage portion 133. According to this variant embodiment, the electrical conductor 209 can easily be disposed in place, for example even when the electrical conductor 209 is a large-sized laminated bus bar that cannot pass through the electrical conductor passage portion 133 provided in the second attachment portion 127.

The first frame 105 and the second frame 106 are fixed to the capacitors 104 in the present embodiment and to the capacitors 204 in the variant embodiment, whereby the first frame 105 is supported by the first support surfaces 117 and the second frame 106 is supported by the second support surfaces 118. Therefore, the capacitors 104, 204 serves, together with the first frame 105 and the second frame 106, as a structural member strong enough to resist a force acting on the capacitor unit. This thus ensures strength of the capacitor unit without additional structural members above and under the capacitors 104, 204, which enables the securing of sufficient strength with a simple structure.

Embodiment 2

In the power conversion apparatus 100 according to Embodiment 1, the second attachment portion 127 is provided with the electrical conductor passage portion 133, which enables arrangement of the electrical conductor 109 to the side (right) of the capacitors 104. This ensures upper and lower open space of the heat dissipation space and facilitates a flow of air under natural convection of air flowing up from bottom in the heat dissipation space, thereby enabling improvement of the cooling effect on the electric circuit element 101 and the capacitors 104. In the power conversion apparatus 200 according to the variant embodiment, providing of the space for passage of the electrical conductor 109 to the second attachment portion 127 is not required, which allows arrangement of the electrical conductor 109, which may be a large sized laminated bus bar. However, arrangement of the electrical conductor 109 above the capacitors 104 blocks the upper heat dissipation space. This results in reduced flowability of air in the heat dissipation space and hinders cooling of the electric circuit element 101 and the capacitors 104.

In Embodiment 2, a power conversion apparatus is described in which an electrical conductor such as a large laminated bus bar is disposed at the side (for example, right) of the capacitors 104 rather than above the upper side thereof, even without providing an electrical conductor passage portion 133 in a second frame.

Figure 7:
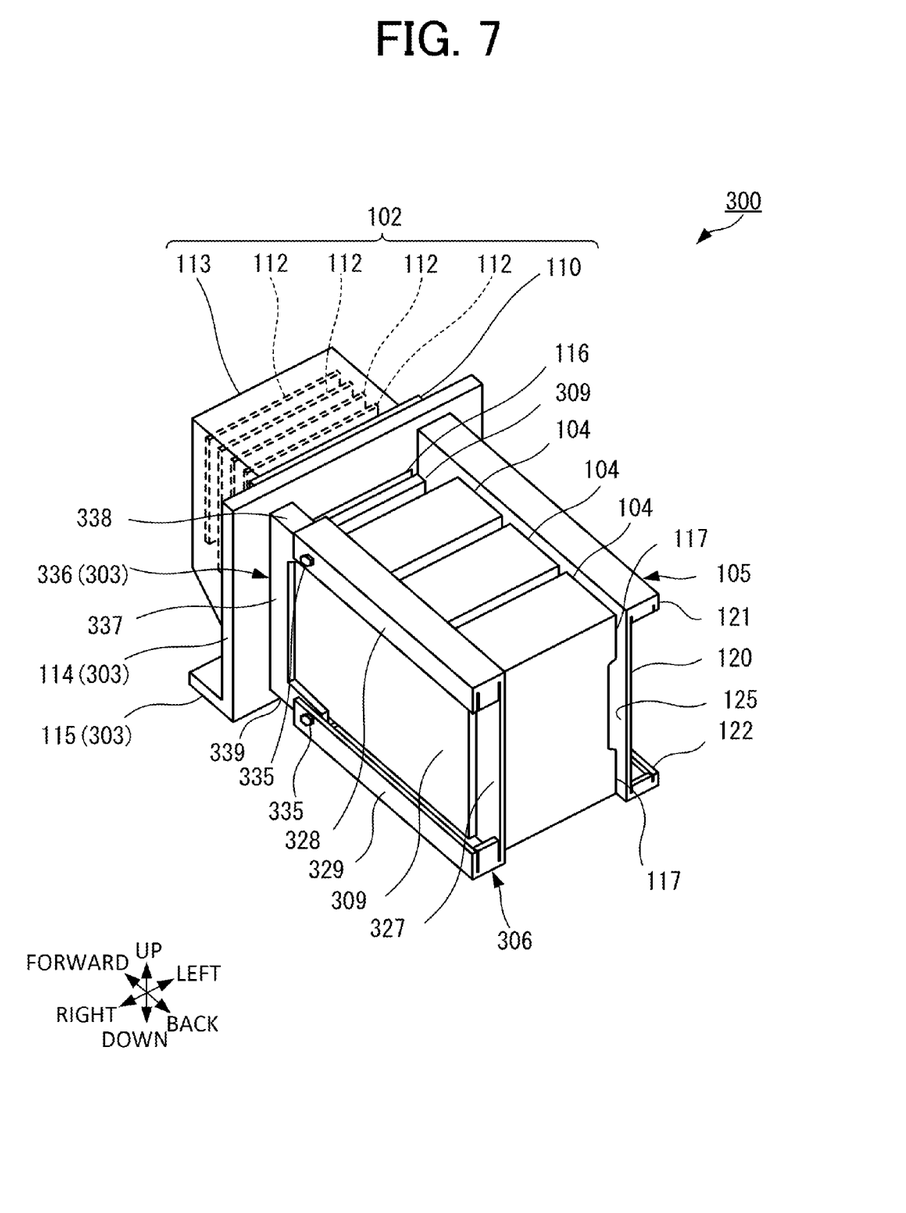
FIG. 7 is a perspective view of a power conversion apparatus according to Embodiment 2 of the present disclosure.
Figure 8:
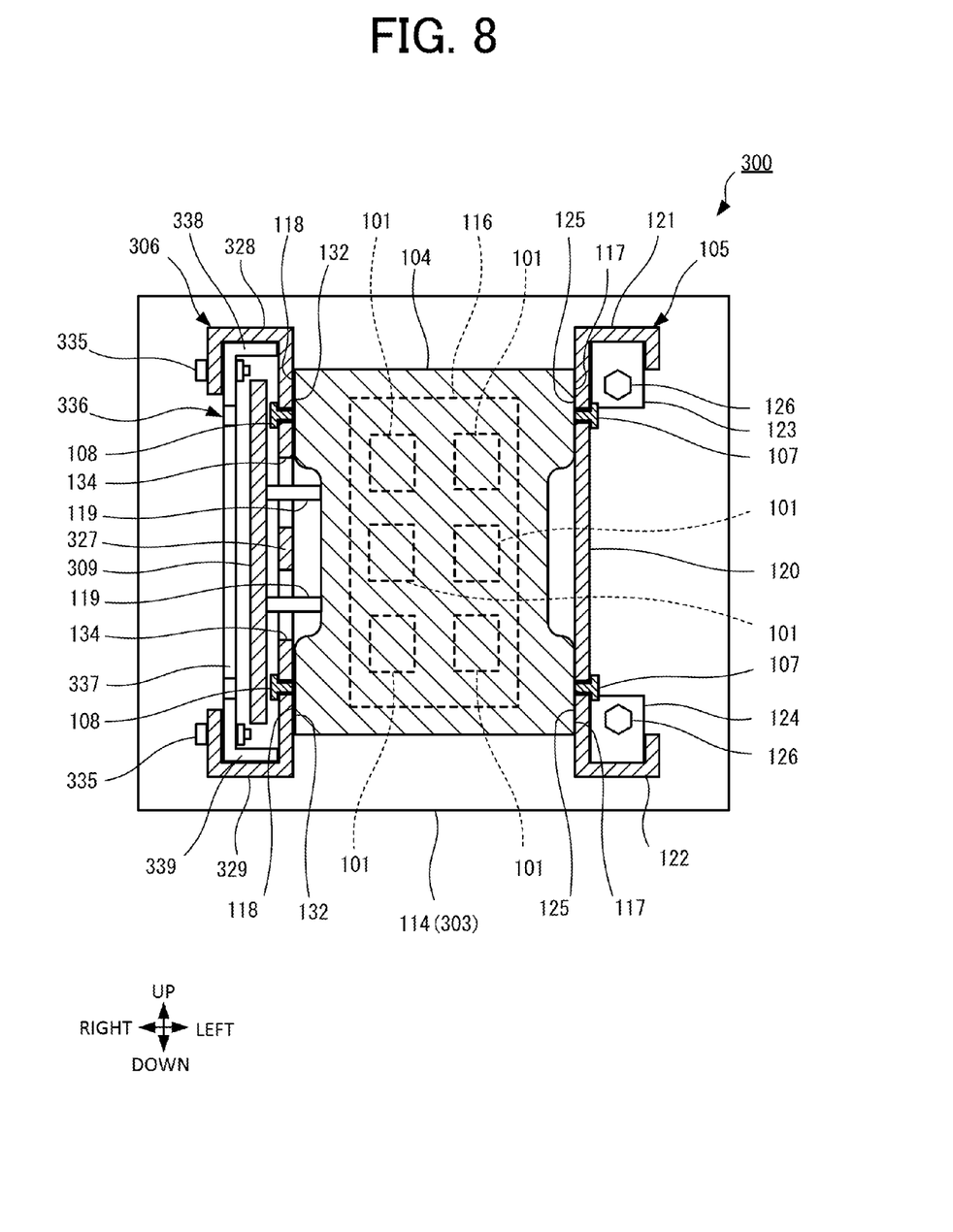
FIG. 8 is a cross sectional view of the power conversion apparatus according to Embodiment 2 as viewed from the rear.

A power conversion apparatus 300 according to the present embodiment includes, as illustrated in FIGS. 7 and 8, an electric circuit element 101, a cooling unit 102, a plurality of capacitors 104, a first frame 105, a first fastener 107, and a second fastener 108, all of which are similar to those of Embodiment 1. The power conversion apparatus 300 includes a connection frame 303, a second frame 306, and an electrical conductor 309, instead of the connection frame 103, the second frame 106, and the electrical conductor 109, respectively, of Embodiment 1.

FIG. 7 is a perspective view of the power conversion apparatus 300 as viewed from the upper right rear. FIG. 8 is a cross sectional view of the power conversion apparatus 300 as viewed from the rear, taken along the line II-II of FIG. 4.

The connection frame 303 is a member disposed between the cooling unit 102 and a capacitor unit to connect between the units, similar to the connection frame 103 of Embodiment 1. The connection frame 303 includes a frame portion 114 and a leg portion 115 similar to those of Embodiment 1, and further includes a connection portion 336.

The connection portion 336 is a member for fixing the second frame 306 to the connection frame 303 and protrudes backward from the rear surface of the frame portion 114. The connection portion 336 is disposed to the right of the electric circuit element 101, and is fixed to the frame portion 114 through an unillustrated bolt and nut, welding, or the like.

Specifically, the connection portion 336 includes a plate-like lateral connection plate 337 that extends vertically in the forward-backward directions, and an upper connection plate 338 and a lower connection plate 339 that extend leftward from the respective upper end and lower end of the lateral connection plate 337. The lateral connection plate 337 is provided with a through-hole in the left-right direction, for insertion of a bolt included in the second fixture 335. This through-hole is provided at a location in the vicinity of each of the upper and lower ends of the lateral connection plate 337 and rearwardly spaced apart by a predetermined distance from the rear surface of the frame portion 114.

The second frame 306 is a structural member that forms the right side portion of the capacitor unit, similar to the second frame 106 of Embodiment 1, and is fixed to the connection portion 336 at a predetermined spacing from the rear surface of the frame portion 114. The second frame 306 includes a second attachment portion 327, a second upper extension portion 328, and a second lower extension portion 329.

Similar to the second attachment portion 127 of Embodiment 1, the second attachment portion 327, which extends vertically in the forward-backward directions, is a plate-like portion forming a generally rectangular shape as viewed from the right. The second attachment portion 327 includes a plurality of fastener holes, a second attachment surface 132, and a plurality of terminal insertion holes 134, similar to the second attachment portion 127 of Embodiment 1. The second attachment portion 327 differs from the second attachment portion 127 of Embodiment 1 in that the second attachment portion 327 is not provided with the electrical conductor passage portion 133.

Similar to the second upper extension portion 128 of Embodiment 1, the second upper extension portion 328 is a portion extending rightward from the upper end of the second attachment portion 327 and further extending downward from the right end of the extended portion. The inner dimension in the left-right direction of the rightward extension of the second upper extension portion 328 is equal to or greater than the outer dimension of the upper connection plate 338.

Similar to the second lower extension portion 129 of Embodiment 1, the second lower extension portion 329 is a portion extending rightward from the lower end of the second attachment portion 327 and further extending upward from the right end of the extended portion. The inner dimension in the left-right direction of the rightward extension of the second lower extension portion 329 is equal to or greater than the outer dimension of the lower connection plate 339.

The downward extended portion of the second upper extension portion 328 and the upward extended portion of the second lower extension portion 329 are each provided with a through-hole penetrating in the left-right direction, for insertion of a bolt included in the second fixture 335.

With the second frame 306 disposed at a predetermined space from the rear surface of the frame portion 114, the through-holes penetrating in the left-right direction of the second frame 306 and the lateral connection plate 337 are aligned with each other at the respective upper and lower parts. The second frame 306 is fixed to the connection portion 336 through insertion of a bolt and a nut (second fixture 335) into the aligned through-holes.

Similar to the electrical conductor 109 of Embodiment 1, the electrical conductor 309 is a member for electrically connecting between the electric circuit element 101 and the terminals 119 of the capacitors 104, and includes a laminated bus bar, an electric wire, or the like. The electrical conductor 309 of the present embodiment is, as illustrated in FIGS. 7 and 8, a bended laminated bus bar that is larger than the electrical conductor 109 of Embodiment 1, and includes a plate-like portion that extends rightward and is electrically connected to the electric circuit element 101, and by a plate-like portion that bends at the right end of the extended portion and further extends backward to be electrically connected to the terminal 119. Such arrangement with a gap between the second attachment portion 327 of the second frame 306 and the frame portion 114 allows a large electrical conductor 109 to be disposed through this gap to the right side of the capacitors 104.

The present embodiment ensures, as in Embodiment 1, strength of the capacitor unit without arrangement of additional structural members above and under the capacitors 104, which enables the securing of sufficient strength with a simple structure.

The electrical conductor 309 can be disposed to the side of the capacitors 104 without providing an electrical conductor passage portion 133 in the second frame 306. Even if the electrical conductor 309 is a large-sized laminated bus bar, the electrical conductor 309 can be disposed to the side of the capacitors 104.

This arrangement of the electrical conductor 109 to the side of the capacitors 104 opens up the heat dissipation space upwardly and downwardly, thereby facilitating a flow of air in the heat dissipation space under natural convection. The ease of flow results in enhanced heat dissipation to the air of the heat dissipation space from the electric circuit element 101 and the capacitors 104, which improves the cooling effects of the electric circuit element 101 and the capacitors 104.

Embodiment 3

Figure 9:
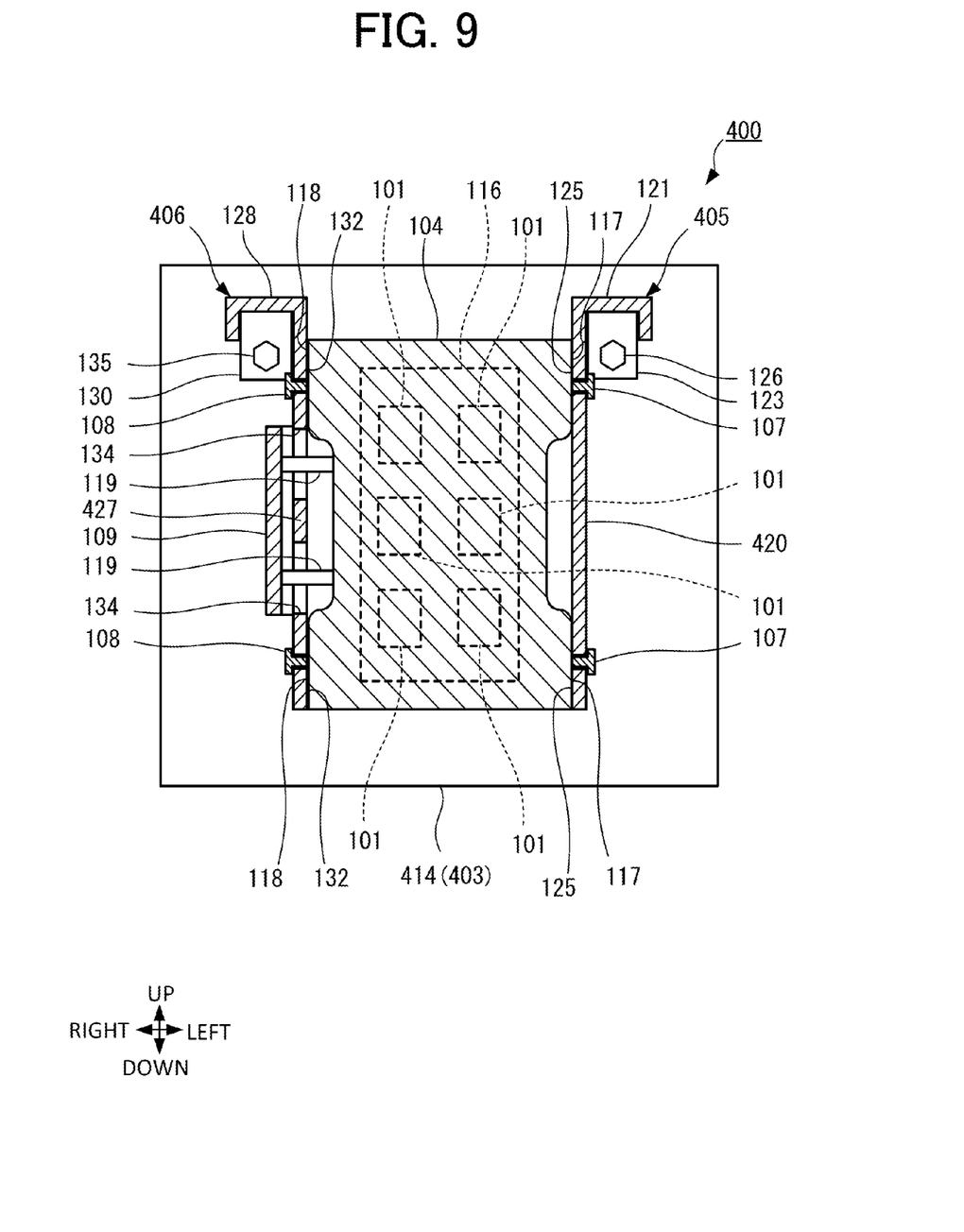
FIG. 9 is a cross sectional view of a power conversion apparatus according to Embodiment 3 of the present disclosure as viewed from the rear.

A power conversion apparatus 400 according to Embodiment 3 includes an electric circuit element 101, a cooling unit 102, a plurality of capacitors 104, a first fastener 107, a second fastener 108, and an electrical conductor 109, all of which are similar to those of Embodiment 1. The power conversion apparatus 400 includes, as illustrated in FIG. 9, a connection frame 403, a first frame 405, and a second frame 406, instead of the connection frame 103, the first frame 105, and the second frame 106, respectively, of Embodiment 1.

The connection frame 403 is a member disposed between the cooling unit 102 and a capacitor unit to connect between the units, similar to the connection frame 103 of Embodiment 1. The connection frame 403 includes a frame portion 414 instead of the frame portion 114 of Embodiment 1, and a leg portion 115 similar to that of Embodiment 1.

The frame portion 414, which has a structure that is generally similar to that of the frame portion 114 of Embodiment 1, is provided only at the upper side with a hole for insertion of a bolt included in a first fixture 126 and a second fixture 135. The frame portion 414 differs from the frame portion 114 of Embodiment 1 in that such a hole is not provided at the lower side.

The first frame 405 is a structural member that forms the left side portion of the capacitor unit, similar to the first frame 105 of Embodiment 1. The first frame 405 includes, as illustrated in FIG. 9, a first attachment portion 420, and a first upper extension portion 121 and a first upper front end portion 123, both of which are similar to those of Embodiment 1. The first frame 405 differs from the first frame 105 of Embodiment 1 in that the first frame 405 does not include the first lower extension portion 122 and the first lower front end portion 124.

The first attachment portion 420 has a structure similar to that of the first attachment portion 120 of Embodiment 1 except that the lower end of the first attachment portion 420 is located at the same elevation (level in the up-down direction) as the bottom surfaces of the capacitors 104.

The second frame 406 is a structural member that forms the left side portion of the capacitor unit, similar to the second frame 106 of Embodiment 1. The second frame 406 includes, as illustrated in FIG. 9, a second attachment portion 427, and a second upper extension portion 128 and a second upper front end portion 130, both of which are similar to those of Embodiment 1. The second frame 406 differs from the second frame 106 of Embodiment 1 in that the second frame 406 does not include the second lower extension portion 129 and the second lower front end portion 131.

The second attachment portion 427 has a structure similar to that of the second attachment portion 127 of Embodiment 1 except that the lower end of the second attachment portion 427 is located at the same elevation as the bottom surfaces of the capacitors 104.

The present embodiment ensures, as in Embodiment 1, strength of the capacitor unit without arrangement of additional structural members above and under the capacitors 104, which enables the securing of sufficient strength with a simple structure.

In the present embodiment, the first frame 405 does not include a first lower extension portion 122 and a first lower front end portion 124, and the second frame 406 does not include a second lower extension portion 129 and a second lower front end portion 131. The first attachment portion 420 and the second attachment portion 427 do not each extend below the bottom surfaces of the capacitors 104. Such configuration structurally simplifies the structure of the power conversion apparatus 400 in comparison to the power conversion apparatus 100 of Embodiment 1. The first frame 405 and the second frame 406 can be manufactured with less material than the first frame 105 and the second frame 106 of Embodiment 1, thus allowing the manufacturing cost of the power conversion apparatus 400 to be reduced.

Embodiment 4

Figure 10:
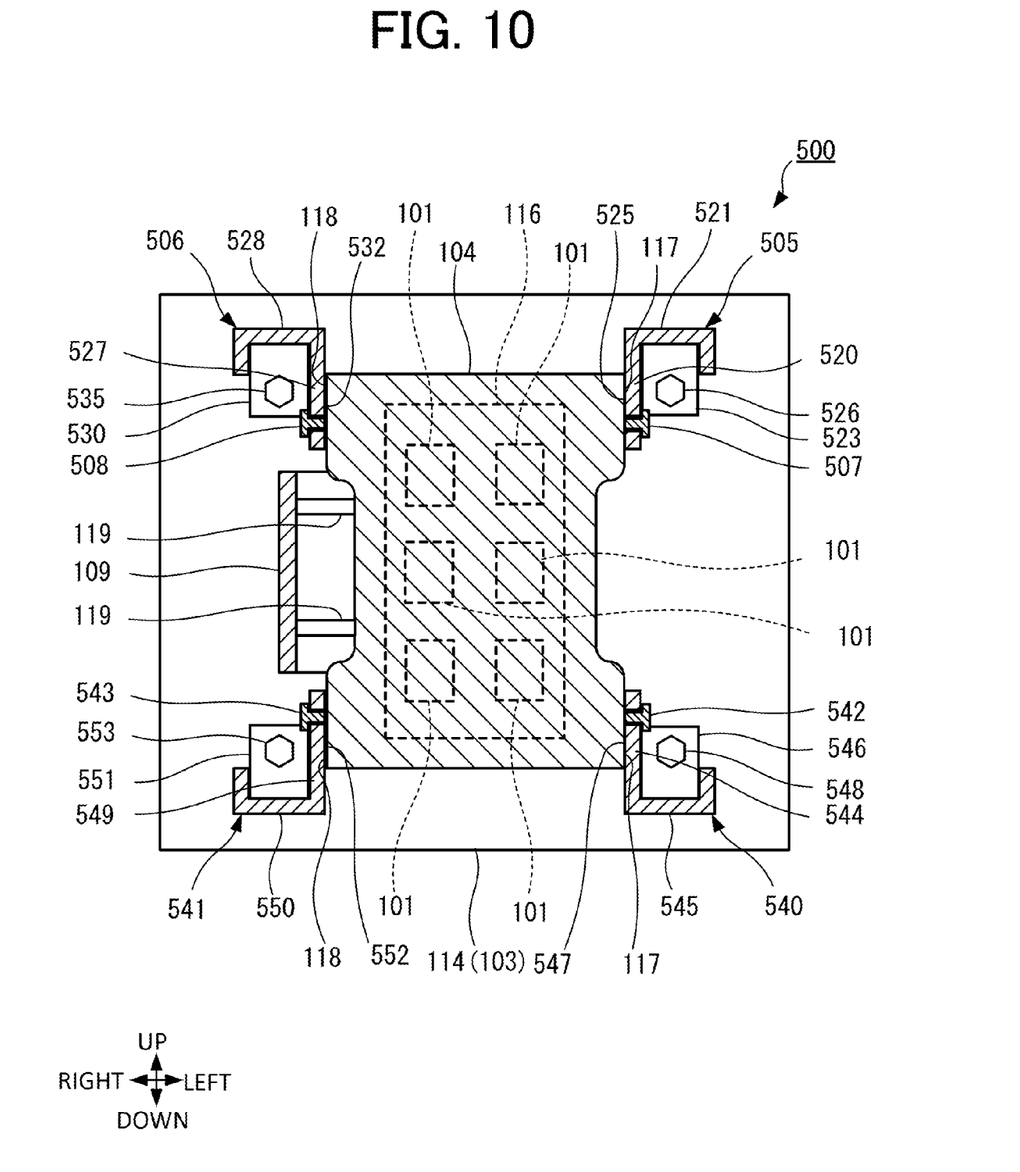
FIG. 10 is a cross sectional view of a power conversion apparatus according to Embodiment 4 of the present disclosure as viewed from the rear.

A power conversion apparatus 500 according to the present embodiment includes an electric circuit element 101, a cooling unit 102, a connection frame 103, a plurality of capacitors 104, and an electrical conductor 109, all of which are similar to those of Embodiment 1. The power conversion apparatus 500 includes, as illustrated in FIG. 10, a first frame 505, a second frame 506, a first fastener 507, and a second fastener 508, instead of a first frame 105, a second frame 106, a first fastener 107, and a second fastener 108, respectively, of Embodiment 1. The power conversion apparatus 500 further includes a third frame 540, a fourth frame 541, a third fastener 542, and a fourth fastener 543.

The first frame 505 and the third frame 540 are structural members that forms the left side of a capacitor unit. The first frame 505 and the third frame 540 correspond to the respective upper and lower side members obtained in a case where the substantially middle portion in the up-down direction of the first attachment portion 120 of Embodiment 1 is removed to make the first frame 105 separated into the upper and lower sides.

The first frame 505 includes a first attachment portion 520, a first upper extension portion 521, and a first upper front end portion 523. The third frame 540 includes a third attachment portion 544, a third lower extension portion 545, and a third lower front end portion 546.

The first attachment portion 520 and the third attachment portion 544, which are spaced apart in the up-down direction, each are a plate-like portion extending vertically in the forward-backward directions and having a generally rectangular shape as viewed from the left. The first attachment portion 520 includes a plurality of fastener holes for insertion of the first fastener 507, and the third attachment portion 544 includes a plurality of fastener holes for insertion of the third fastener 542. The first attachment portion 520 and the third attachment portion 544 also include a first attachment surface 525 and a third attachment surface 547, respectively, both of which form the major surface of the right side.

The first attachment surface 525 and the third attachment surface 547 are on the same virtual plane extending vertically in the forward-backward directions. The first attachment portion 520 and the third attachment portion 544 each are fixed to the capacitor 104 through the respective ones of the first fastener 507 and the third fastener 542 so that the first attachment surface 525 is supported by first support surface 117 at the upper side of the capacitors 104 and the third attachment surface 547 is supported by the first support surface 117 at the lower side of the capacitors 104.

The first upper extension portion 521 and the third lower extension portion 545 are portions configured similarly to the first upper extension portion 121 and the first lower extension portion 122 of Embodiment 1, respectively. Specifically, the first upper extension portion 521 is a portion extending leftward from the upper end of the first attachment portion 520 and further extending downward from the left end of the extended portion. The third lower extension portion 545 is a portion extending leftward from the lower end of the third attachment portion 544 and further extending upward from the left end of the extended portion.

The first upper front end portion 523 and the third lower front end portion 546 are portions for fixing the first frame 505 and the third frame 540 to the frame portion 114, respectively, and are configured similarly to the first upper front end portion 123 and the first lower front end portion 124 of Embodiment 1, respectively.

Specifically, the first upper front end portion 523 is the front end portion of the first frame 505 and is a plate-like portion extending downward from the first upper extension portion 521. The first upper front end portion 523 has a front surface secured in abutting relation to the rear surface of the frame portion 114 by a first fixture 526 for fixing the first frame 505 and the frame portion 114. The first fixture 526 includes, for example, a bolt and a nut provided in holes formed in association with the respective ones of the first upper front end portion 523 and the frame portion 114.

The third lower front end portion 546 is the front end portion of the third frame 540 and is a plate-like portion extending upward from the third lower extension portion 545. The third lower front end portion 546 has a front surface secured in abutting relation to the rear surface of the frame portion 114 by a third fixture 548 for fixing the third frame 540 and the frame portion 114. The third fixture 548 includes, for example, a bolt and a nut provided in holes formed in association with the respective ones of the third lower front end portion 546 and the frame portion 114.

The second frame 506 and the fourth frame 541 are structural members that form the right side portions of the capacitor unit. The second frame 506 and the fourth frame 541 correspond to the respective upper and lower members obtained in a case where a substantially middle portion in the up-down direction of the second attachment portion 127 of Embodiment 1 is removed to separate the second frame 106 into the upper and lower parts.

The second frame 506 includes a second attachment portion 527, a second upper extension portion 528, and a second upper front end portion 530. The fourth frame 541 includes a fourth attachment portion 549, a fourth lower extension portion 550, and a fourth lower front end portion 551.

The second attachment portion 527 and the fourth attachment portion 549, which are spaced apart in the up-down direction, each are a plate-like portion extending vertically in the forward-backward directions and having a generally rectangular shape as viewed from the right. The second attachment portion 527 includes a plurality of fastener holes for insertion of the second fastener 508, and the fourth attachment portion 549 includes a plurality of fastener holes for insertion of the fourth fastener 543. The second attachment portion 527 and the fourth attachment portion 549 also include a second attachment surface 532 and a fourth attachment surface 552, respectively, both of which form the major surface of the left side.

The second attachment surface 532 and the fourth attachment surface 552 are on the same virtual plane extending vertically in the forward-backward directions, and are opposed to the first attachment surface 525 and the third attachment surface 547, respectively. The second attachment portion 527 and the fourth attachment portion 549 each are fixed to the capacitors 104 through the second fastener 508 and the fourth fastener 543, respectively, so that the second attachment surface 532 is supported by a second support surfaces 118 at the upper side of the capacitors 104, and the fourth attachment surface 552 is supported by the second support surfaces 118 at the lower side of the capacitors 104.

The electrical conductor 109 and the terminals 119 of the capacitors 104 are disposed to pass between the second attachment portion 527 and the fourth attachment portion 549.

The second upper extension portion 528 and the fourth lower extension portion 550 are portions configured similarly to the second upper extension portion 128 and the second lower extension portion 129 of Embodiment 1, respectively. Specifically, the second upper extension portion 528 is a portion extending rightward from the upper end of the second attachment portion 527 and further extending downward from the right end of the extended portion. The fourth lower extension portion 550 is a portion extending rightward from the lower end of the fourth attachment portion 549 and further extending upward from the right end of the extended portion.

The second upper front end portion 530 and the fourth lower front end portion 551 are portions for fixing the second frame 506 and the fourth frame 541, respectively, to the frame portion 114 and are configured similarly to the second upper front end portion 130 and the second lower front end portion 131, respectively, of Embodiment 1.

Specifically, the second upper front end portion 530 is the front end portion of the second frame 506 and is a plate-like portion extending downward from the second upper extension portion 528. The second upper front end portion 530 has a front surface secured in abutting relation to the rear surface of the frame portion 114 by a second fixture 535 for fixing the second frame 506 and the frame portion 114. The second fixture 535 includes, for example, a bolt and a nut provided in holes formed in association with the respective ones of the second upper front end portion 530 and the frame portion 114.

The fourth lower front end portion 551 is the front end portion of the fourth frame 541 and is a plate-like portion extending upward from the fourth lower extension portion 550. The fourth lower front end portion 551 has a front surface secured in abutting relation to the rear surface of the frame portion 114 by a fourth fixture 553 for fixing the fourth frame 541 and the frame portion 114. The fourth fixture 553 includes a bolt and nut provided in holes formed, for example, in association with the respective ones of the fourth lower front end portion 551 and the frame portion 114.

The first fastener 507, the second fastener 508, the third fastener 542, and the fourth fastener 543 are members for respectively securing the first frame 505, the second frame 506, the third frame 540, and the fourth frame 541 to the capacitors 104. The first fastener 507, the second fastener 508, the third fastener 542, and the fourth fastener 543 according to the present embodiment are, for example bolts, which are inserted into respective fastener holes of the first attachment portion 520, the second attachment portion 527, the third attachment portion 544, and the fourth attachment portion 549. The first fastener 507 and the third fastener 542 are tightened into respective internal threads disposed in the upper side and the lower side of the first support surfaces 117 of the capacitors 104. The second fastener 508 and the fourth fastener 543 are tightened into respective internal threads disposed in the upper side and the lower side of the second support surfaces 118 of the capacitors 104.

In the present embodiment, the first frame 505, the second frame 506, the third frame 540, and the fourth frame 541 each are fixed to the capacitors 104. Thus, the first frame 505 and the third frame 540 are supported by the first support surfaces 117, and the second frame 506 and the fourth frame 541 are supported by the second support surfaces 118. Therefore, the capacitors 104 serves, together with the first frame 505, the second frame 506, the third frame 540, and the fourth frame 541, as a structural member strong enough to resist force acting on the capacitor unit. This thus ensures strength of the capacitor unit without arrangement of structural members above and under the capacitors 104, which enables the securing of sufficient strength with a simple structure.

In the present embodiment, the electrical conductor 109 can be disposed to the side of the electric circuit element 101 and the capacitors 104, passing through a space between the second frame 506 and the fourth frame 541. This arrangement allows upwardly and downwardly opening of the heat dissipation space, thereby facilitating a flow of air in the heat dissipation space under natural convection. The arrangement in the present embodiment leaves a large open space at the left and right sides direction of the electric circuit element 101 and the capacitors 104, thus allowing for ease of flow of air in the heat dissipation space. The ease of flow results in enhanced heat dissipation from the electric circuit element 101 and the capacitors 104 to the air of the heat dissipation space, which improves the cooling effects of the electric circuit element 101 and the capacitors 104.

According to the present embodiment, the first frame 505, the second frame 506, the third frame 540, and the fourth frame 541 can be manufactured with less materials than the first frame 105 and the second frame 106 of Embodiment 1. Thus, the manufacturing cost of the power conversion apparatus 500 can be made lower than manufacturing cost of the power conversion apparatus 100 of Embodiment 1.

Although embodiments and variant embodiments of the present disclosure have been described, the present disclosure is not intended to be limited thereto, but includes any appropriate combination of the embodiments and variant embodiments and various modifications thereof.

For example, Embodiments 2 and 3 can be combined. Specifically, the second frame 306 that does not include the second lower extension portion 129 and the second lower front end portion 131 can be fixed to the connection portion 336 of the connection frame 303 in the same manner as in Embodiment 2. In this combination, the connection portion 336 is configured by the upper portion (for example, upper half) of the lateral connection plate 337 and the upper connection plate 338, but may optionally include the lower portion (for example, lower half) of the lateral connection plate 337 and the lower connection plate 339.

For example, Embodiments 2 and 4 can be combined. Specifically, the connection frame 303 includes the connection portion 336, and the upper side and the lower side corresponding to the upper and lower parts of the separated second frame 306 each are fixed to the connection portion 336 in the same manner as in Embodiment 2.

These embodiments have similar effects as in Embodiment 2. In other words, these embodiments enable the securing of sufficient strength with a simple structure. Even if the electrical conductor 309 (see FIG. 7) is a large-sized laminated bus bar, the electrical conductor 309 can be disposed to the side of the capacitors 104, thereby enabling improvement of the effect of cooling the electric circuit element 101 and the capacitors 104.

INDUSTRIAL APPLICABILITY

A power conversion apparatus according to the present disclosure can advantageously be used for railway cars, mobile cranes, watercraft, aircraft, industrial machines, and the like.

REFERENCE SIGNS LIST 100, 200, 300, 400, 500 Power conversion apparatus
101 Electric circuit element
102 Cooling unit
103, 303, 403 Connection frame
104, 204 Capacitor
105, 405, 505 First frame
106, 306, 406, 506 Second frame
107, 507 First fastener
108, 508 Second fastener
109, 209, 309 Electrical conductor 110 Base portion
111 Heat pipe
112 Heat dissipating fin
114, 414 Frame portion
116 Through-hole
117 First support surface
118 Second support surface
119, 219 Terminal
120, 420, 520 First attachment portion
121, 521 First upper extension portion
122 First lower extension portion
123, 523 First upper front end portion
124 First lower front end portion
125, 525 First attachment surface
126, 526 First fixture
127, 327, 427, 527 Second attachment portion
128, 328, 528 Second upper extension portion
129, 329 Second lower extension portion
130, 530 Second upper front end portion
131 Second lower front end portion
132, 532 Second attachment surface
133 Electrical conductor passage portion
134 Terminal insertion hole
135, 335, 535 Second fixture
336 Connection portion
337 Lateral connection plate
338 Upper connection plate
339 Lower connection plate
540 Third frame
541 Fourth frame
542 Third fastener
543 Fourth fastener
544 Third attachment portion
545 Third lower extension portion
546 Third lower front end portion
547 Third attachment surface
548 Third fixture
549 Fourth attachment portion
550 Fourth lower extension portion
551 Fourth lower front end portion
552 Fourth attachment surface
553 Fourth fixture

The invention claimed is:

1. A power conversion apparatus, comprising:
an electric circuit element configured to operate for power conversion, the electric circuit element generating heat during operation;
a cooler attached to the electric circuit element and configured to cool the electric circuit element by releasing into the air the heat generated by the electric circuit element in operation;
a connection frame including a plate-like frame portion to which the cooler is attached;
a capacitor that is a structural member disposed in a direction perpendicular to the frame portion and including a capacitor element electrically connected to the electric circuit element, the capacitor including a first support surface and a second support surface that are external surfaces facing in opposite directions from each other and parallel to the direction perpendicular to the frame portion;
a first frame including an end portion fixed to the connection frame and a first attachment surface fixed to the first support surface; and
a second frame including an end portion fixed to the connection frame and a second attachment surface opposed to the first attachment surface and fixed to the second support surface,
wherein the direction perpendicular to the frame portion is horizontal,
wherein the first support surface is one side surface of the capacitor and the second support surface is another side surface of the capacitor, and
wherein the first frame and the second frame do not cover a top surface of the capacitor.

2. The power conversion apparatus according to claim 1, wherein the first frame and the second frame are both fixed to the frame portion.

3. The power conversion apparatus according to claim 1, wherein
the first frame is attached to the frame portion,
the connection frame further includes a connection portion for fixing the second frame, the connection portion protruding from the frame portion in the direction perpendicular to the frame portion, and
the second frame is fixed to the connection portion to define a gap between the second frame and the frame portion.

4. The power conversion apparatus according to claim 3, further comprising:
an electrical conductor disposed through the gap between the second frame and the frame portion, and electrically connecting the electric circuit element and the capacitor.

5. The power conversion apparatus according to claim 1, wherein the first frame and the second frame include lower end portions positioned at a same level as a bottom surface of the capacitor.

6. The power conversion apparatus according to claim 1, further comprising:
a third frame including an end portion fixed to the frame portion, and a third attachment surface disposed flush with and below the first attachment surface; and
a fourth frame including an end portion fixed to the frame portion, and a fourth attachment surface disposed flush with and below the second attachment surface and opposed to the third attachment surface,
wherein the first support surface includes an area in which the first attachment surface is fixed and an area in which the third attachment surface is fixed below the area in which the first attachment surface is fixed, and
wherein the second support surface includes an area in which the second attachment surface is fixed and an area in which the fourth attachment surface is fixed below the area in which the second attachment surface is fixed.

7. The power conversion apparatus according to claim 1, wherein the electric circuit element and the capacitor are opposed and spaced apart.

8. The power conversion apparatus according to claim 1, wherein
the capacitor includes a terminal protruding toward a side to which the second frame is attached, and
the second frame includes a terminal insertion hole into which the terminal is inserted.

9. The power conversion apparatus according to claim 1, including a plurality of the capacitors arranged and spaced apart in the direction perpendicular to the frame portion.

* * * * *